(12) United States Patent
Huang et al.

(10) Patent No.: US 11,705,494 B2
(45) Date of Patent: Jul. 18, 2023

(54) GALLIUM NITRIDE COMPONENT AND DRIVE CIRCUIT THEREOF

(71) Applicant: Huawei Technologies Co., Ltd., Shenzhen (CN)

(72) Inventors: Boning Huang, Dongguan (CN); Zhaozheng Hou, Dongguan (CN); Qimeng Jiang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/695,539

(22) Filed: Mar. 15, 2022

(65) Prior Publication Data

US 2022/0199795 A1 Jun. 23, 2022

Related U.S. Application Data

(63) Continuation of application No. PCT/CN2020/085612, filed on Apr. 20, 2020.

(51) Int. Cl.
*H01L 29/00* (2006.01)
*H01L 29/423* (2006.01)
(Continued)

(52) U.S. Cl.
CPC .... *H01L 29/42316* (2013.01); *H01L 29/2003* (2013.01); *H01L 29/205* (2013.01);
(Continued)

(58) Field of Classification Search
CPC .......... H01L 29/42316; H01L 29/2003; H01L 29/205; H01L 29/475; H01L 29/7786; H03K 17/284
See application file for complete search history.

(56) References Cited

U.S. PATENT DOCUMENTS

| 10,607,840 B2 | 3/2020 | Harada et al. |
| 2010/0097105 A1 | 4/2010 | Morita et al. |

(Continued)

FOREIGN PATENT DOCUMENTS

| CN | 101523614 A | 9/2009 |
| CN | 102237781 A | 11/2011 |

(Continued)

OTHER PUBLICATIONS

Shiojima et al., "Large Schottky barriers for Ni/ p-GaN contacts," Applied Physics Letters, vol. 74, No. 14, pp. 1936-1938, American Institute of Physics (Apr. 5, 1999).
(Continued)

*Primary Examiner* — Tuan T Lam
(74) *Attorney, Agent, or Firm* — Leydig, Voit and Mayer, Ltd.

(57) ABSTRACT

This application provides a gallium nitride component and a drive circuit thereof. The gallium nitride component includes: a substrate; a gallium nitride (GaN) buffer layer formed on the substrate; an aluminum gallium nitride (AlGaN) barrier layer formed on the GaN buffer layer; and a source, a drain, and a gate formed on the AlGaN barrier layer. The gate includes a P-doped gallium nitride (P—GaN) cap layer formed on the AlGaN barrier layer, and a first gate metal and a second gate metal formed on the P—GaN cap layer. A Schottky contact is formed between the first gate metal and the P—GaN cap layer, and an ohmic contact is formed between the second gate metal and the P—GaN cap layer. In the technical solution provided in this application, the gallium nitride component is a normally-off component, and is conducive to design of a drive circuit.

15 Claims, 8 Drawing Sheets

(51) Int. Cl.
*H01L 29/20* (2006.01)
*H01L 29/205* (2006.01)
*H01L 29/47* (2006.01)
*H01L 29/778* (2006.01)
*H03K 17/284* (2006.01)

(52) U.S. Cl.
CPC ........ *H01L 29/475* (2013.01); *H01L 29/7786* (2013.01); *H03K 17/284* (2013.01)

(56) References Cited

U.S. PATENT DOCUMENTS

| | | |
|---|---|---|
| 2014/0225161 A1 | 8/2014 | Okita et al. |
| 2016/0380091 A1 | 12/2016 | Okawa |

FOREIGN PATENT DOCUMENTS

| | | | |
|---|---|---|---|
| CN | 102637723 A | | 8/2012 |
| CN | 102810559 A | | 12/2012 |
| CN | 103579326 A | | 2/2014 |
| CN | 106298907 A | | 1/2017 |
| CN | 106783960 A | | 5/2017 |
| CN | 108735810 A | | 11/2018 |
| CN | 110518068 A | * | 11/2019 |
| CN | 110648914 A | | 1/2020 |
| WO | 2019035242 A1 | | 2/2019 |

OTHER PUBLICATIONS

Greco et al., "Ohmic contacts to Gallium Nitride materials," Applied Surface Science, vol. 383, pp. 324-345, Elsevier, Amsterdam, NL (Apr. 13, 2016).

* cited by examiner

GALLIUM NITRIDE COMPONENT AND DRIVE CIRCUIT THEREOF

CROSS-REFERENCE TO RELATED APPLICATIONS

This application is a continuation of International Application No. PCT/CN2020/085612, filed on Apr. 20, 2020, the disclosure of which is hereby incorporated by reference in its entirety.

TECHNICAL FIELD

This application relates to the field of semiconductor technologies, and in particular, to a gallium nitride component and a drive circuit thereof.

BACKGROUND

As a power supply product develops towards a trend of high efficiency and miniaturization, a gallium nitride component such as a power switch manufactured based on a wide forbidden band semiconductor material such as gallium nitride attracts increasing attention. Currently, the gallium nitride component mainly includes a component based on a lateral heterostructure of aluminum gallium nitride/gallium nitride (AlGaN/GaN), and a two-dimensional electron gas (2DEG) channel with high electron mobility can be naturally formed in an interface of the heterostructure. Generally, a 2DEG in the interface of the heterostructure is difficult to be depleted, so that a current gallium nitride component based on the AlGaN/GaN heterostructure is usually a normally-on component.

A stable conduction current is required to maintain conduction of the normally-on gallium nitride component, and a reverse voltage needs to be applied to a gate to disconnect the component. This feature is not conducive to design of a drive circuit and has relatively high component power consumption. In addition, the normally-on gallium nitride component can hardly ensure fail-security of a circuit system (for example, a power conversion circuit system). Although some enhanced gallium nitride components implement a normally-off feature, component performance needs to be improved.

SUMMARY

This application provides a gallium nitride component and a drive circuit thereof. The gallium nitride component is a normally-off component and is conducive to design of a drive circuit. In addition, the gallium nitride component has a small gate leakage current and a small driving loss, and therefore has an improved electron hole injection capability in a conduction process.

According to a first aspect, this application provides a gallium nitride component, including: a substrate; a gallium nitride GaN buffer layer formed on the substrate; an aluminum gallium nitride AlGaN barrier layer formed on the GaN buffer layer; and a source, a drain, and a gate formed on the AlGaN barrier layer. The gate includes a P-doped gallium nitride P—GaN cap layer formed on the AlGaN barrier layer, and a first gate metal and a second gate metal formed on the P—GaN cap layer. A Schottky contact is formed between the first gate metal and the P—GaN cap layer, and an ohmic contact is formed between the second gate metal and the P—GaN cap layer.

The gallium nitride component provided in this application has a hybrid gate structure that includes a Schottky gate and an ohmic gate, so that not only gate leakage currents in a conduction process can be reduced to reduce driving power consumption, but also a large quantity of electron holes can be injected into the AlGaN barrier layer during conduction to optimize a dynamic resistance, thereby improving component reliability.

In an embodiment, the first gate metal and the second gate metal are disposed in parallel at intervals along a direction perpendicular to a gate width direction of the gate.

In an embodiment, the gate includes a plurality of first gate metals and a plurality of second gate metals.

In an embodiment, the plurality of first gate metals and the plurality of second gate metals are alternately distributed at intervals along a gate width direction of the gate, to evenly optimize a dynamic resistance of the gallium nitride component along the gate width direction while reducing a component driving loss, thereby improving reliability of the gallium nitride component.

In an embodiment, the plurality of second gate metals include one longitudinal gate metal that is close to an edge that is of the P—GaN cap layer and that is parallel to a gate width direction of the gate, and that extends along the gate width direction, and a plurality of lateral gate metals distributed and disposed along the gate width direction. One end of each lateral gate metal is connected to the longitudinal gate metal. The plurality of second gate metals and the plurality of lateral gate metals are alternately distributed along the gate width direction In an embodiment, the gallium nitride component further includes a depletion-type high electron mobility transistor HEMT. A source of the depletion-type HEMT is coupled to the first gate metal, a gate of the depletion-type HEMT is coupled to the source of the gallium nitride component, and a drain of the depletion-type HEMT is coupled to the second gate metal. The depletion-type HEMT can implement functions of components such as a gate driving resistor and a switch in a gallium nitride drive circuit, so that the components can be saved in the drive circuit, thereby helping simplify the drive circuit.

According to a second aspect, this application provides a drive circuit, including a gate driver and the gallium nitride component provided in the first aspect of this application and any embodiment of the first aspect. The first gate metal and the second gate metal of the gallium nitride component are coupled to a signal output end of the gate driver, and a gate driving resistor and a switch are connected in series between the second gate metal and the signal output end of the gate driver.

In an embodiment, the switch is configured to open after a delay of preset duration when a rising edge of a driving signal of the gate driver arrives.

In an embodiment, the switch is configured to close when a falling edge of a driving signal of the gate driver arrives.

DESCRIPTION OF EMBODIMENTS

Gallium nitride (GaN) is a compound of nitrogen and gallium, and is a direct band gap semiconductor of group III (boron group element) and group V (nitrogen group element). Gallium nitride has a wide band gap of 3.4 eV (electron volt), while silicon, a currently most commonly used semiconductor material, has a band gap of 1.12 eV. Therefore, gallium nitride has better performance than a silicon component in high-power and high-speed components.

A band gap (or energy gap) is also referred to as an energy band gap or a width of forbidden band, and generally refers to an energy difference between a top of a valence band and a bottom of a conduction band in a semiconductor or an insulator. A direct band gap (direct band gaps) is an energy band structure in which a minimum value at a bottom of a conduction band and a maximum value at a top of a valence band in a semiconductor material correspond to a same k value in k space. A semiconductor with this structure is referred to as a direct transition semiconductor (or referred to as a direct band gap semiconductor).

Figure 1:
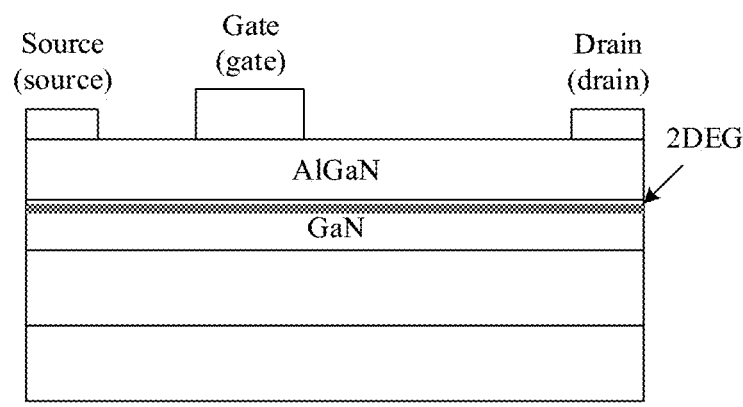
FIG. 1 is a schematic structural diagram of a current gallium nitride component.

As a power supply product develops towards a trend of high efficiency and miniaturization, a gallium nitride component such as a power switch manufactured based on a wide forbidden band semiconductor material such as gallium nitride attracts increasing attention. As shown in FIG. 1, currently, the gallium nitride component mainly includes a component based on a lateral heterostructure of aluminum gallium nitride/gallium nitride (AlGaN/GaN), for example, a high electron mobility transistor (HEMT). There is a relatively high two-dimensional electron gas 2DEG in an interface of the AlGaN/GaN heterostructure. Therefore, a 2DEG channel with high electron mobility can be naturally formed in the interface of the AlGaN/GaN heterostructure, so that the gallium nitride component has a smaller chip area than a semiconductor silicon component when the two components have a same conduction resistance. Gallium nitride is a wide forbidden band semiconductor. A working temperature of the gallium nitride is also extremely high, and may usually reach above 500° C., so that the gallium nitride component has a working capability in a high temperature condition. The gallium nitride also has a relatively high breakdown electric field, so that the gallium nitride component has a relatively high gate-drain breakdown voltage, and has a working capability in a high voltage condition.

Because the gallium nitride is a high polar semiconductor material, it is usually difficult to deplete the 2DEG with a high concentration that is naturally formed in the interface of the lateral heterostructure of the AlGaN/GaN. As a result, a gallium nitride component based on the AlGaN/GaN heterostructure is usually a normally-on component. A stable conduction current is required to maintain conduction of the normally-on gallium nitride component, and a reverse voltage needs to be applied to a gate to disconnect the component. This feature is not conducive to design of a drive circuit and has relatively high component power consumption. In addition, the normally-on gallium nitride component can hardly ensure fail-security of a circuit system (for example, a power conversion circuit system).

An embodiment of this application provides a gallium nitride component. The gallium nitride component is a normally-off component and is conducive to design of a drive circuit. In addition, the gallium nitride component has a small gate leakage current and a small driving loss, and therefore has a high electron hole injection capability in a conduction process.

Figure 2:
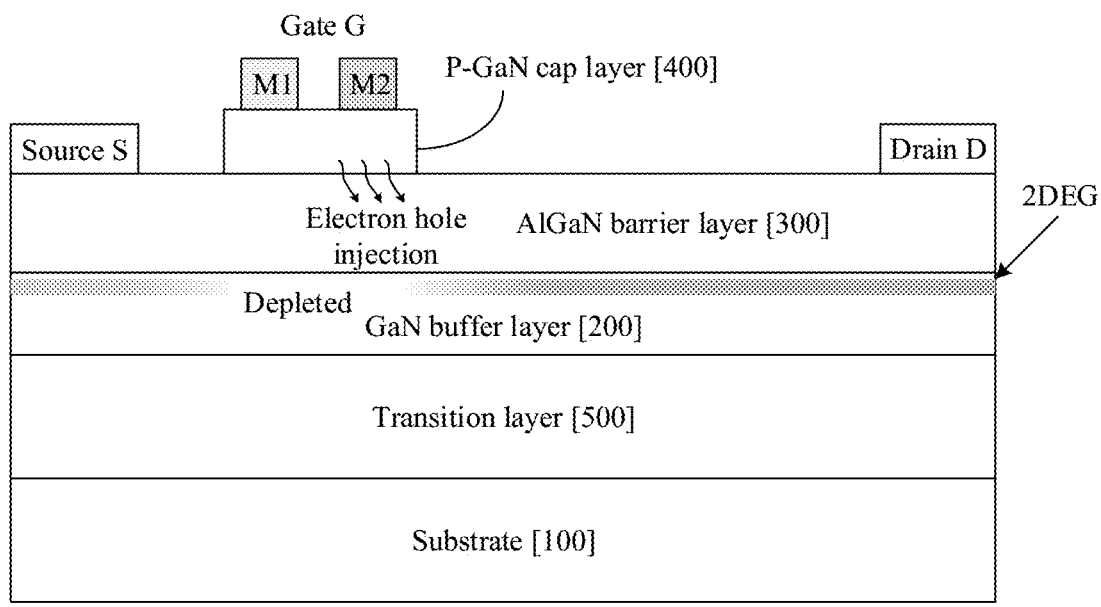
FIG. 2 is a schematic structural diagram of a gallium nitride component according to an embodiment of this application.

FIG. 2 is a schematic structural diagram of a gallium nitride component according to an embodiment of this application. As shown in FIG. 2, the gallium nitride component includes a substrate 100; a gallium nitride GaN buffer layer 200 formed on the substrate 100; an aluminum gallium nitride AlGaN barrier layer 300 formed on the GaN buffer layer 200; and a source (G), a drain (D), and a gate (G) formed on the AlGaN barrier layer 300. The gate G includes a P-doped gallium nitride P—GaN cap layer 400 formed on the AlGaN barrier layer 300, and a first gate metal M1 and a second gate metal M2 formed on the P—GaN cap layer 400. A Schottky contact is formed between the first gate metal M1 and the P—GaN cap layer 400, and an ohmic contact is formed between the second gate metal M2 and the P—GaN cap layer 400.

The substrate 100 is used as a base board of the gallium nitride component, and may be made of a material such as silicon Si, silicon carbide SiC, or sapphire $Al_2O_3$.

Optionally, because gallium nitride and a material of the substrate 100 are different, and usually have different lattice constants and coefficients of thermal expansion. If the GaN buffer layer 200 is directly grown on the substrate 100, an epitaxial layer crack may be generated due to problems such as lattice mismatch and thermal mismatch between the GaN buffer layer 200 and the substrate 100, and consequently, crystal quality is reduced. Therefore, to avoid generation of the epitaxial layer crack, a dedicated transition layer 500 may be first grown on the substrate 100, and then the GaN buffer layer 200 is grown on the transition layer 500.

The transition layer 500 may be generated using different materials based on different materials of the substrate 100. For example, when a Si substrate is used, the transition layer 500 may be generated using aluminum gallium nitride AlGaN. When an $Al_2O_3$ substrate is used, the transition layer 500 may be generated using an aluminum nitride AlN layer generated by nitriding $Al_2O_3$ by ammonia $NH_3$.

The Schottky contact is a Schottky barrier formed through bending of an energy band of a semiconductor in a boundary surface when a gate metal (for example, the first gate metal M1) and a semiconductor material (for example, the P—GaN cap layer 400) are in contact with each other.

Figure 3:
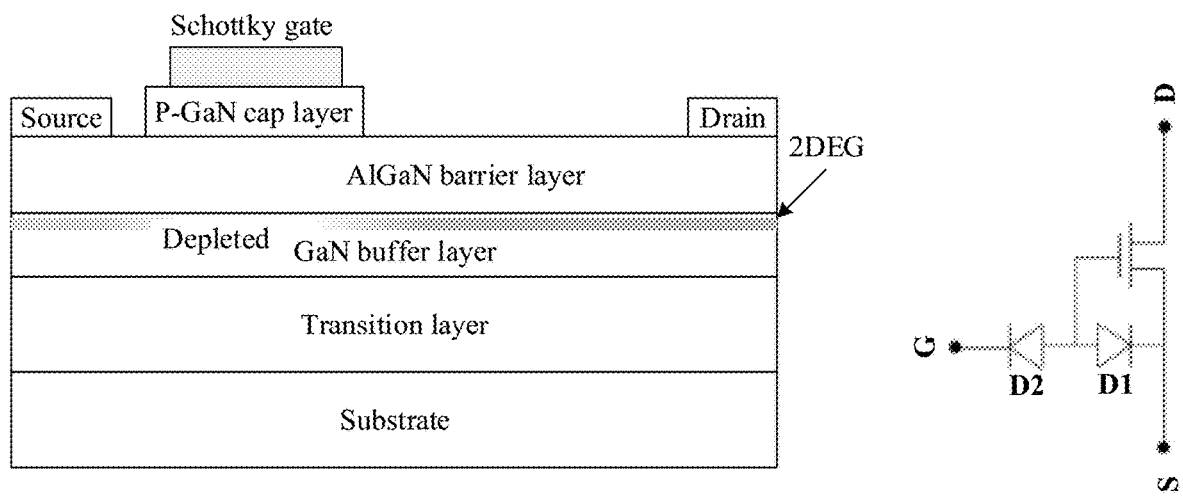
FIG. 3 is a schematic structural diagram and an equivalent circuit diagram of a gallium nitride component with a Schottky gate.

A gate metal and a semiconductor material that are in the Schottky contact may constitute a Schottky gate of the gallium nitride component. FIG. 3 is a schematic structural diagram and an equivalent circuit diagram of a gallium nitride component with a Schottky gate. As shown in FIG. 3, a 2DEG channel is formed in an interface of an AlGaN/GaN heterostructure including the AlGaN barrier layer and the GaN buffer layer, and the P—GaN cap layer may deplete the 2DEG channel below the P—GaN cap layer, so that the component is normally off. However, an access region of the component still maintains the 2DEG channel. The access region is a region in which the 2DEG channel is located between the Schottky gate and the source and between the Schottky gate and the drain. Therefore, when a specific voltage is applied to the Schottky gate, the 2DEG channel below the Schottky gate may be re-established to conduct the component. A value of the voltage applied to the Schottky gate needs to be greater than a conduction voltage (that is, a threshold voltage) of the gallium nitride component.

Further, as shown in FIG. 3, the Schottky gate may be equivalent to a pair of diodes disposed back to back, and specifically include a forward disposed diode D1 equivalent to a Schottky junction and a reverse disposed diode D2 equivalent to the P—GaN cap layer. Based on this equivalent structure, the Schottky gate is conducive to reduce gate leakage currents of the gallium nitride component, thereby reducing driving power consumption of the component. However, when the gallium nitride component with the Schottky gate structure is conducted, an electron hole injection capability is normal, and a good dynamic resistance feature cannot be obtained.

Figure 4:
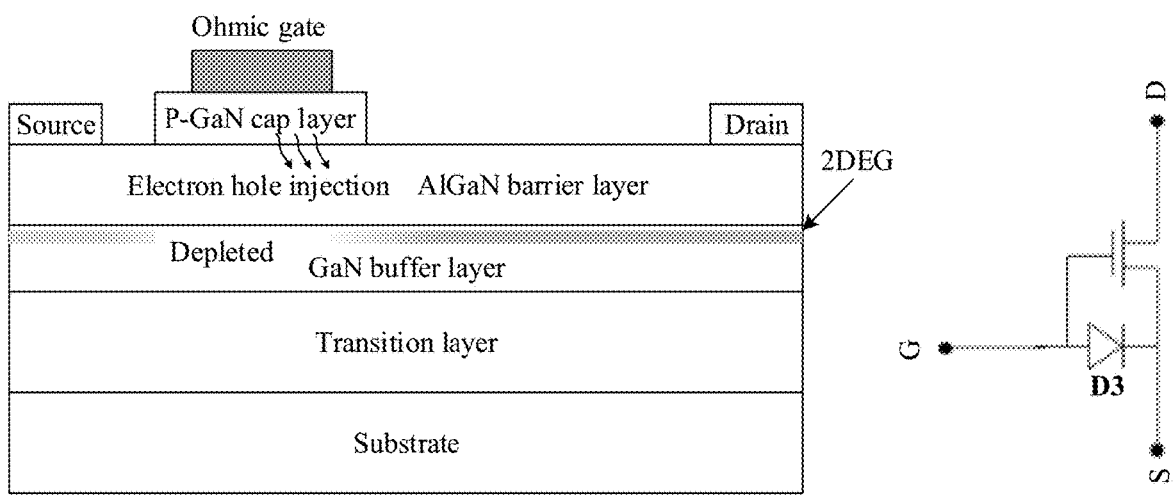
FIG. 4 is a schematic structural diagram and an equivalent circuit diagram of a gallium nitride component with an ohmic gate.

A gate metal and a semiconductor material that are in the ohmic contact may constitute an ohmic gate of the gallium nitride component. FIG. 4 is a schematic structural diagram and an equivalent circuit diagram of a gallium nitride component with an ohmic gate. As shown in FIG. 4, the ohmic gate may be equivalent to a forward disposed diode D3, so that the gallium nitride component with the ohmic gate can inject a large quantity of electron holes into the AlGaN barrier layer from the P—GaN cap layer during conduction, to help the gallium nitride component releases an electron captured by an electron trap when the gallium nitride component is disconnected, thereby optimizing a dynamic resistance of the gallium nitride component and improving reliability of the gallium nitride component. However, the gallium nitride component with the ohmic contact gate structure needs to continuously maintain a current in a conduction process, and driving power consumption is relatively high.

Further, as shown in FIG. 2, according to the gallium nitride component provided in this embodiment of this application, the Schottky contact is formed between the first gate metal M1 and the P—GaN cap layer 400, and the ohmic contact is formed between the second gate metal M2 and the P—GaN cap layer 400, to form a hybrid gate structure that includes the Schottky gate (which may be represented by M1 in the following) and the ohmic gate (which may be represented by M2 in the following). The hybrid gate structure overcomes a disadvantage that the gallium nitride component using the single Schottky gate cannot inject a large quantity of electron holes into the AlGaN barrier layer 300 during conduction, and also overcomes a disadvantage that the gallium nitride component using the single ohmic gate needs to continuously maintain a current in a conduction process, causing relatively high driving power consumption. It can be learned that the gallium nitride component provided in this embodiment of this application not only can reduce gate leakage currents in a conduction process to reduce driving power consumption, but also can inject a large quantity of electron holes into the AlGaN barrier layer 300 during conduction to optimize a dynamic resistance, thereby improving component reliability.

Figure 5:
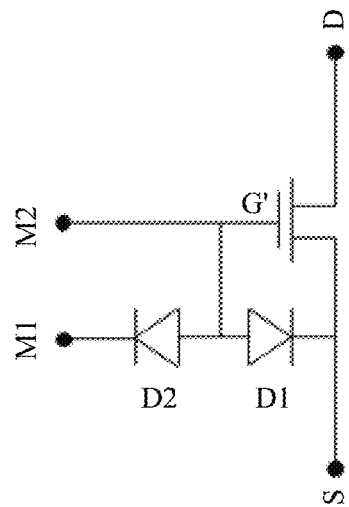
FIG. 5 is an equivalent circuit diagram of the gallium nitride component shown in FIG. 2.

FIG. 5 is an equivalent circuit diagram of the gallium nitride component shown in FIG. 2. As shown in FIG. 5, the Schottky gate in the hybrid gate structure may be equivalent to a pair of diodes disposed back to back, and specifically include a forward disposed diode D1 equivalent to a Schottky junction and a reverse disposed diode D2 equivalent to the P—GaN cap layer 400. The first gate metal M1 is coupled to a cathode of the diode D2, an anode of the diode D2 is coupled to an anode of the diode D1, and a cathode of the diode D1 is coupled to the source S of the gallium nitride component. The second gate metal M2 is equivalently coupled to a potential point G' of the pGaN cap layer 400. The second gate metal M2 and the potential point G' are further coupled to the anode of the diode D2 and to the anode of the diode D1.

In this embodiment of this application, one or more first gate metals M1 and one or more second gate metals M2 may be disposed on the P—GaN cap layer 400. The gallium nitride component may have different features by changing a quantity and layout manner of first gate metals M1 and second gate metals M2, and a contact area between the P—GaN cap layer 400 and each of the first gate metal M1 and the second gate metal M2.

Figure 6:
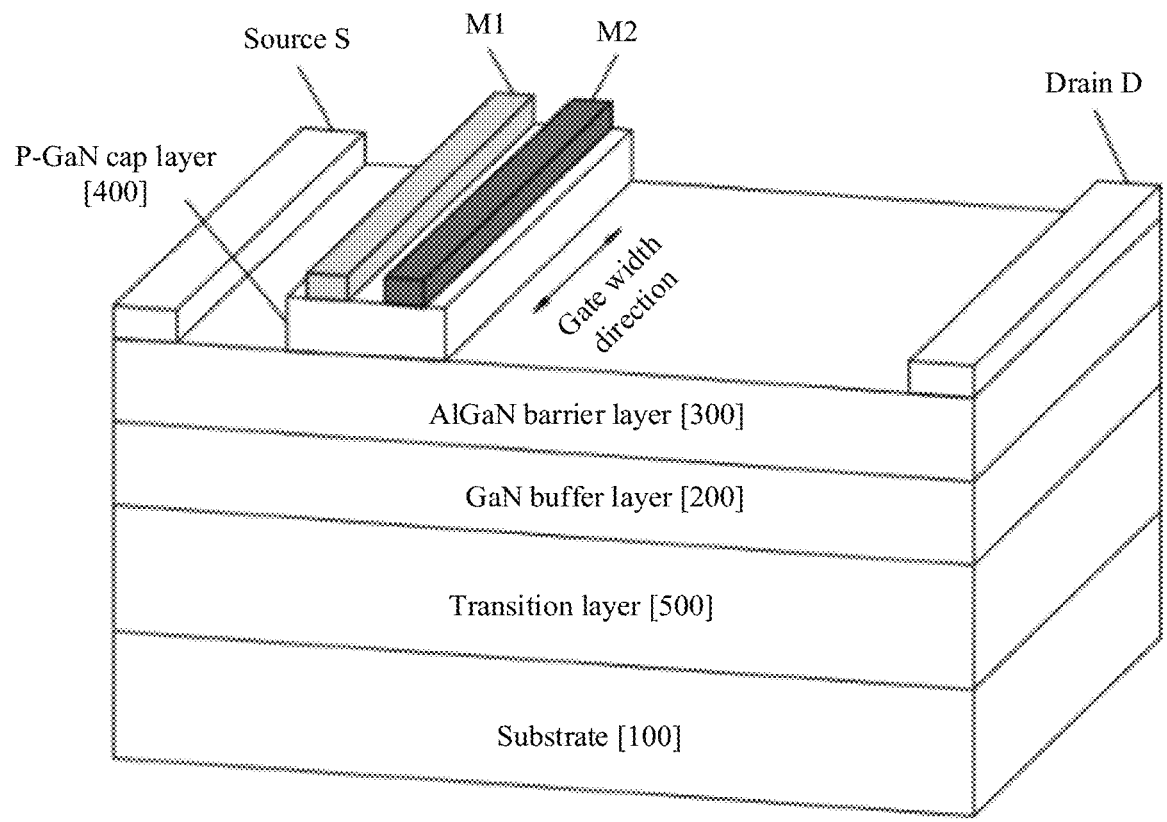
FIG. 6 is a schematic diagram of a layout manner of gate metals of a gallium nitride component according to an embodiment of this application.

FIG. 6 is a schematic diagram of a layout manner of gate metals of a gallium nitride component according to an embodiment of this application. As shown in FIG. 6, the gallium nitride component includes one first gate metal M1 and one second gate metal M2, and the first gate metal M1 and the second gate metal M2 are disposed in parallel at intervals along a direction perpendicular to a gate width direction of the gate.

In the direction perpendicular to the gate width direction, the first gate metal M1 may be disposed on a side close to the source S, the second gate metal M2 may be disposed on a side close to the drain D; or the first gate metal M1 may be disposed on a side close to the drain D, and the second gate metal M2 may be disposed on a side close to the source S. This is not specifically limited in this embodiment of this application.

In addition, in the gate width direction, the first gate metal M1 and the second gate metal M2 may extend from one end to the other end of the P—GaN cap layer 400. Therefore, the P—GaN cap layer 400 can form the Schottky contact with the first gate metal M1 in the entire gate width direction, so that the gate can have a relatively low leakage current in the entire gate width direction, thereby helping reduce a driving loss. The P—GaN cap layer 400 can further form the ohmic contact with the second gate metal M2 in the entire gate width direction, so that when the gallium nitride component is conducted, an electron hole can be injected into the AlGaN barrier layer 300 in the entire gate width direction, thereby optimizing a dynamic resistance of the gallium nitride component as a whole, and improving reliability of the gallium nitride component.

Figure 7:
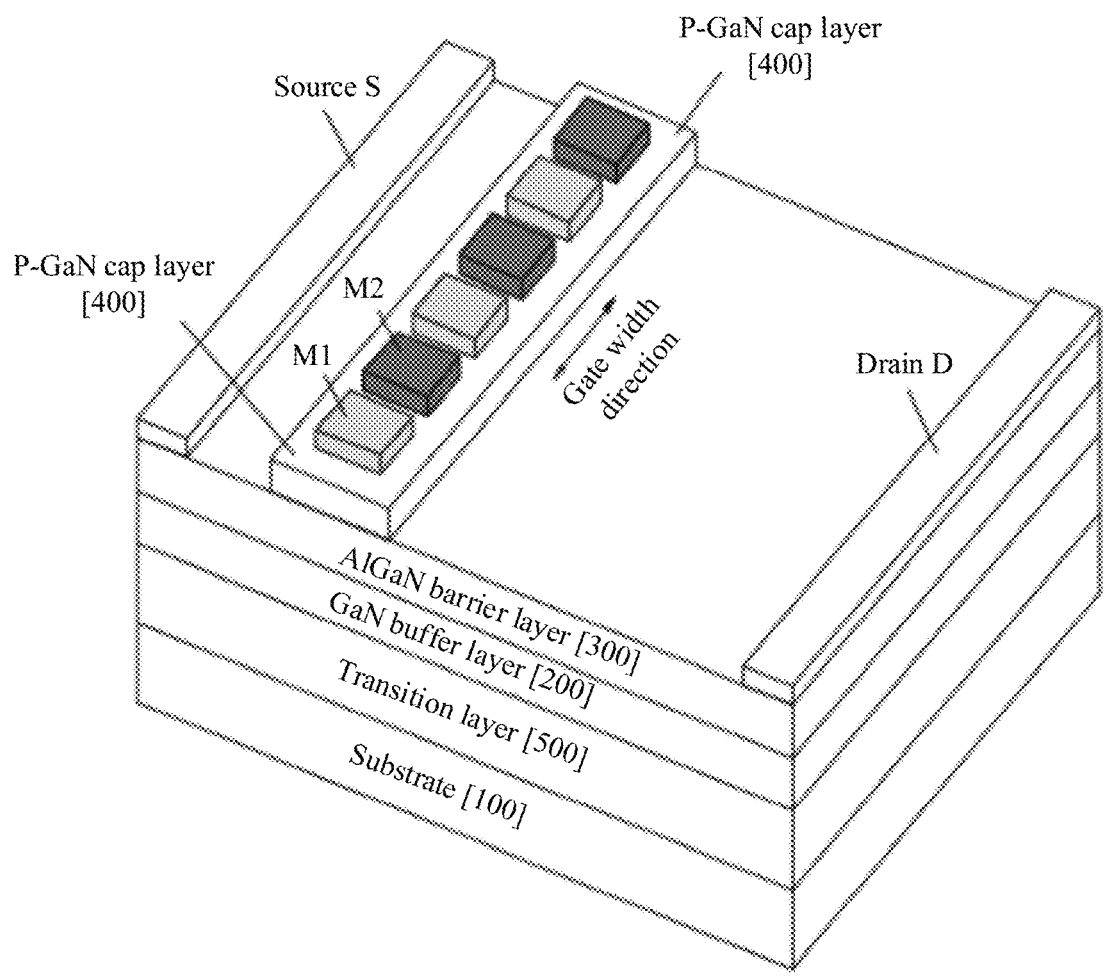
FIG. 7 is a schematic diagram of another layout manner of gate metals of a gallium nitride component according to an embodiment of this application.

FIG. 7 is a schematic diagram of another layout manner of gate metals of a gallium nitride component according to an embodiment of this application. As shown in FIG. 7, the gallium nitride component includes a plurality of first gate metals M1 and a plurality of second gate metals M2, and the plurality of first gate metals M1 and the plurality of second gate metals M2 are arranged in a row along a gate width direction and are alternately distributed at intervals. In this way, a low leakage current region (that is, a region below the first gate metal M1) and an electron hole injection region (that is, a region below the second gate metal M2) below the gate are alternately distributed along the gate width direction, to evenly optimize a dynamic resistance of the gallium nitride component along the gate width direction while reducing a component driving loss, thereby improving reliability of the gallium nitride component.

Contact areas between the P—GaN cap layer 400 and metal gates including the first gate metal M1 and the plurality of second gate metal M2 may be the same or may be different. The gallium nitride component may have different features by changing the contact area between the metal gate and the P—GaN cap layer 400.

For example, under a limited size of the P—GaN cap layer 400, when a contact area between the first gate metal M1 and the P—GaN cap layer 400 is enlarged and a contact area between the second gate metal M2 and the P—GaN cap layer 400 is reduced, a gate leakage current of the gallium nitride component is weakened, which is conducive to further reduce a driving loss and a conduction voltage of the gallium nitride component, but reduces a capability of injecting an electron hole into the AlGaN barrier layer 300 when the gallium nitride component is conducted.

For another example, under a limited size of the P—GaN cap layer, when a contact area between the first gate metal M1 and the P—GaN cap layer 400 is reduced, and a contact area between the second gate metal M2 and the P—GaN cap layer 400 is enlarged, the gallium nitride component may inject more electron holes into the AlGaN barrier layer 300 during conduction, thereby further optimizing a dynamic resistance of the gallium nitride component and improving reliability of the gallium nitride component, but limiting further reduction of driving power consumption of the gallium nitride component.

Therefore, based on the structure of the gallium nitride component with a hybrid gate shown in this embodiment of this application, a person skilled in the art may properly design, based on an actual requirement of circuit design, a quantity and layout of first gate metals M1 and second metal gates M2 and the contact area between the P—GaN cap layer 400 and each of the first gate metal M1 and the second gate metal M2. This is not specifically limited in this embodiment of this application.

Figure 8:
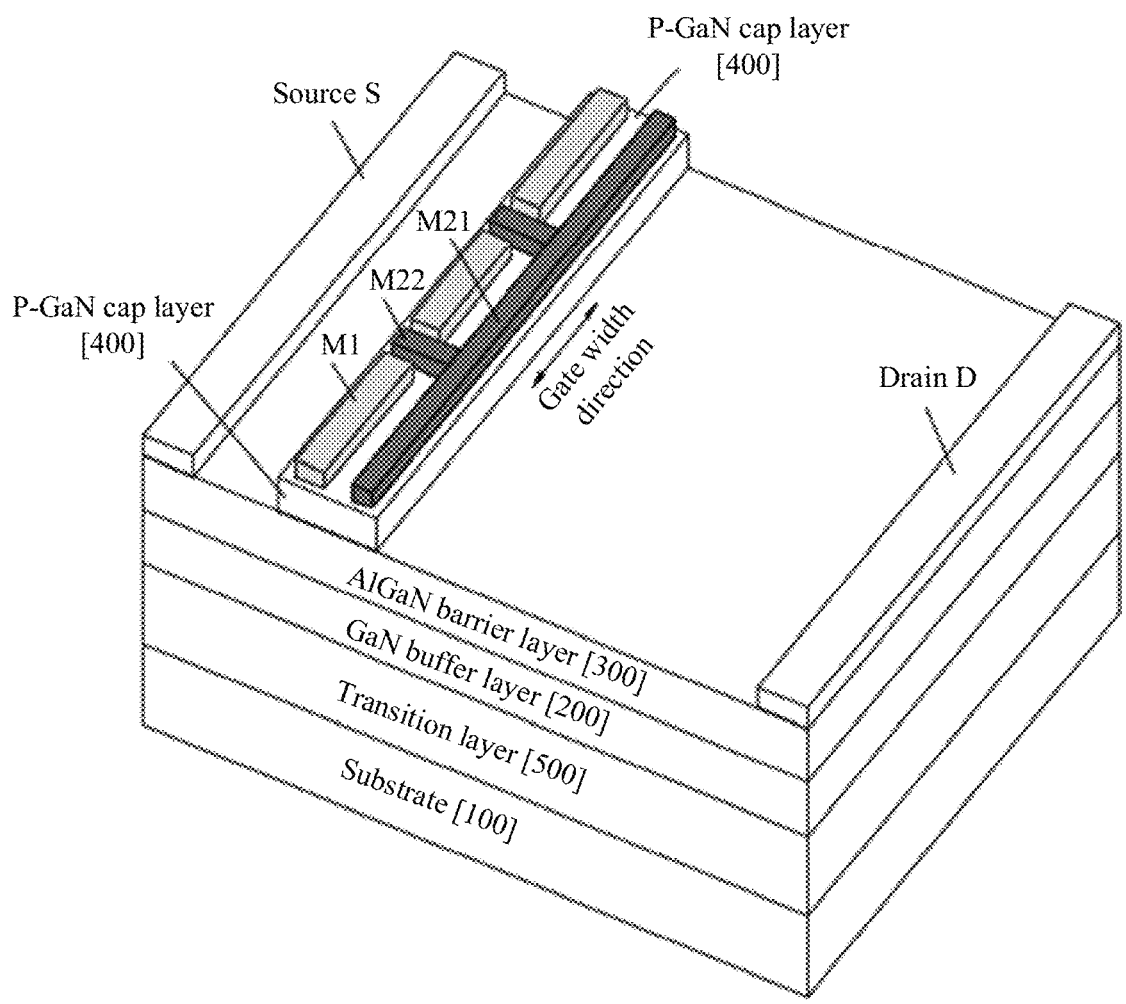
FIG. 8 is a schematic diagram of still another layout manner of gate metals of a gallium nitride component according to an embodiment of this application.

For example, when the gallium nitride component includes a plurality of first gate metals M1 and a plurality of second gate metals M2, the plurality of first gate metals M1 and the plurality of second gate metals M2 may be further in a layout shown in FIG. 8. The plurality of second gate metals M2 include one longitudinal gate metal M21 and at least one lateral gate metal M22. The longitudinal gate metal M21 is close to an edge that is of the P—GaN cap layer 400 and that is parallel to the gate width direction, and extends along the gate width direction. The at least one lateral gate metal M22 is located on a same side as the longitudinal gate metal M21, and is distributed and disposed at intervals along the gate width direction. One end of each lateral gate metal M22 is connected to the longitudinal gate metal M21. The plurality of first gate metals M2 are distributed between the lateral gate metals M22 to form a form in which the first gate metals M1 and the plurality of lateral gate metals M22 are alternately distributed along the gate width direction.

Figure 9:
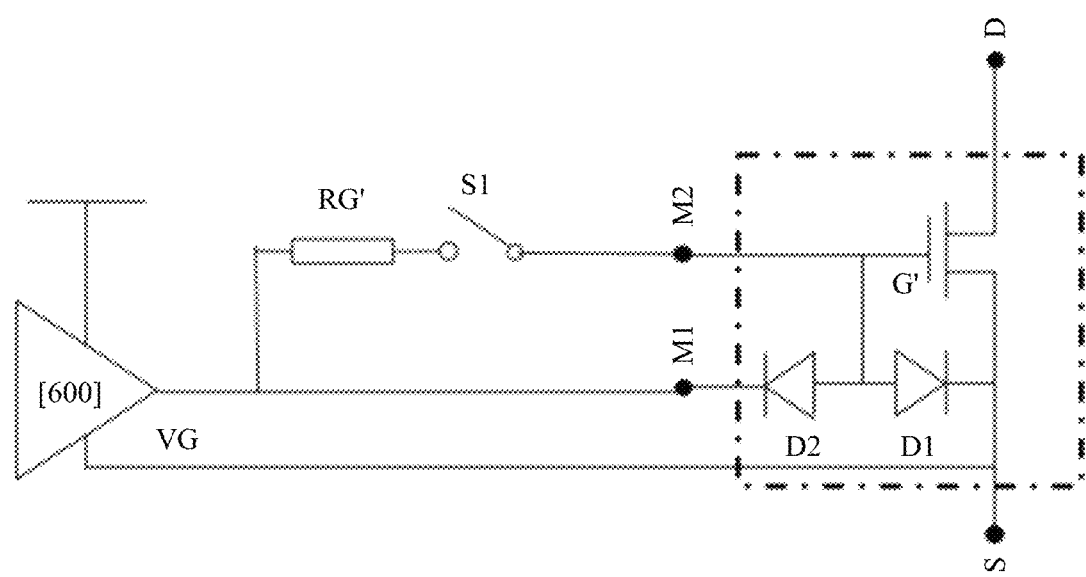
FIG. 9 is a schematic diagram of a drive circuit according to an embodiment of this application.

An embodiment of this application further provides a drive circuit, configured to drive any of the foregoing gallium nitride components with the hybrid gate structure. FIG. 9 shows a schematic diagram of the drive circuit. As shown in FIG. 9, the drive circuit includes a gate driver 600. An output end of the gate driver 600 is coupled to the first gate metal M1 and the second gate metal M2 of the gallium nitride component, and a gate driving resistor RG' and a switch SG' are connected in series between the second gate metal M2 and a signal output end of the gate driver 600.

The gate driver 600 is configured to generate a driving signal VG. The driving signal VG may be a voltage signal. Conduction and disconnection of the gallium nitride component may be controlled by outputting driving signals VG of different voltages to the gate of the gallium nitride component.

In this embodiment of this application, the gate driving resistor RG' has a function of eliminating gate drive ringing in the drive circuit. Specifically, there is a capacitive structure between the gate and the drain D of the gallium nitride component and between the gate and the source S of the gallium nitride component, a parasitic inductance is inevitably generated in a gate loop of the gallium nitride component. As a result, the gate loop generates drive ringing under excitation of the driving signal VG of the gate driver 600. If the gate driving resistor RG' is added to the gate loop, the drive ringing can be eliminated.

In this embodiment of this application, the gate driving resistor RG' further has a function of adjusting a conduction/disconnection speed of the gallium nitride component. Specifically, a smaller gate driving resistor RG' indicates a higher conduction/disconnection speed of the gallium nitride component, and a larger gate driving resistor RG' indicates a lower conduction/disconnection speed of the gallium nitride component. A high/low conduction/disconnection speed of the gallium nitride component is related to a loss and interference of the component. A person skilled in the art may probably select a size of the gate driving resistor RG' based on an actual requirement of circuit design. This is not specifically limited in this embodiment of this application.

Figure 10:
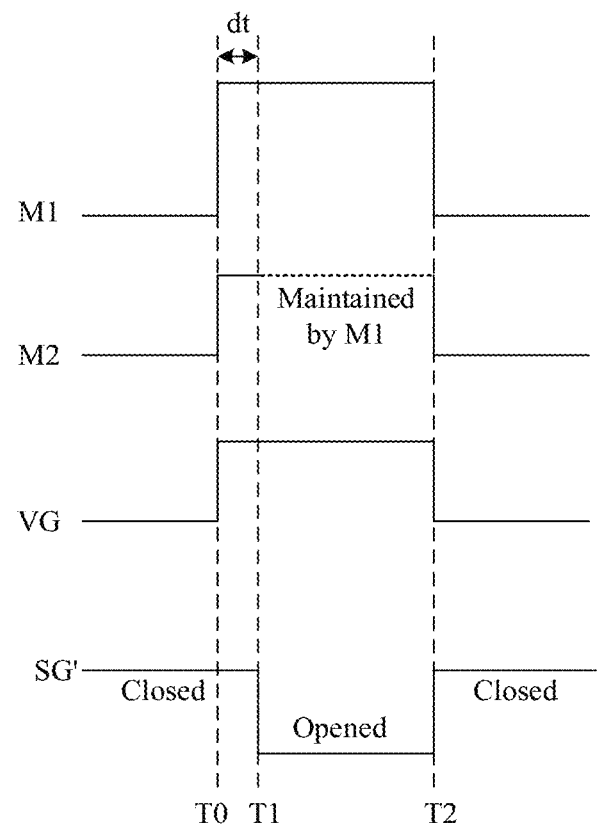
FIG. 10 is a diagram of a driving time sequence of a drive circuit according to an embodiment of this application.

FIG. 10 is a diagram of a driving time sequence of a drive circuit according to an embodiment of this application. As shown in FIG. 10, before a moment T0, when the driving signal VG is located at a low potential, the switch SG' is set to a closed state, the gallium nitride component is disconnected, and potentials of the Schottky gate M1 and the ohmic gate M2 both are low potentials. At the moment T0, when a rising edge of the driving signal VG arrives, the switch SG' is still set to the closed state, and the potentials of the Schottky gate M1 and the ohmic gate M2 are inverted to high potentials, so that the gallium nitride component is conducted. When the driving time sequence delays preset duration dt from the moment T0 to reach a moment T1, the switch SG' is opened to decrease a driving current. In this case, the potential of the Schottky gate M1 is still maintained at the high potential, and the potential point G' of the pGaN cap layer below the ohmic gate M2 can also be maintained at the high potential by the high potential of the Schottky gate M1, to maintain establishment of a 2DEG below the gate, thereby maintaining a conducted state of the gallium nitride component. At a moment T2, when a falling edge of the driving signal VG arrives, the switch SG' is closed again, and the potentials of the Schottky gate M1 and the ohmic gate M2 are inverted back to low potentials, so that the gallium nitride component is disconnected.

In another embodiment, functions of the switch SG' and the gate driving resistor RG' in the drive circuit shown in FIG. 10 may be integrated into the gallium nitride component, to save the switch SG' and the gate driving resistor RG' in the drive circuit.

Figure 11:
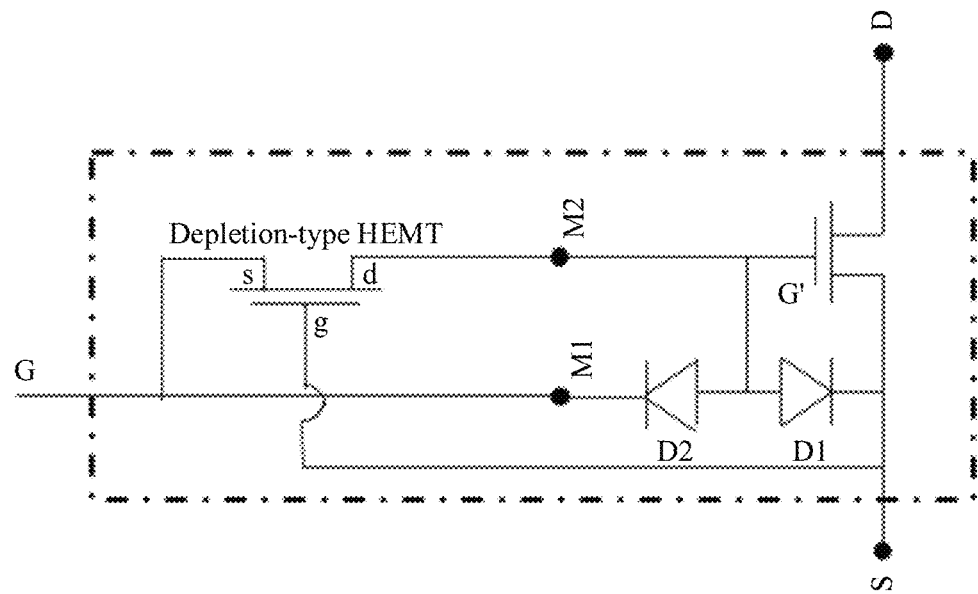
FIG. 11 is a schematic structural diagram of another gallium nitride component according to an embodiment of this application.

FIG. 11 is a schematic structural diagram of a gallium nitride component that integrates functions of a switch SG' and a gate driving resistor RG'. As shown in FIG. 11, a depletion-type high electron mobility transistor HEMT is integrated into the gallium nitride component, and the functions of the switch SG' and the gate driving resistor RG' are implemented by using the depletion-type HEMT. A specific integration manner is as follows: The first gate metal M1 is used as the gate G of the gallium nitride component after being coupled to a source s of the depletion-type HEMT, and is configured to be coupled to a driving signal. A gate g of the depletion-type HEMT is coupled to the source S of the gallium nitride component. A drain d of the depletion-type HEMT is coupled to the second gate metal M2 of the gallium nitride component.

When a voltage Vgs of the gate g relative to the source s of the depletion-type HEMT meets Vgs=0, a 2DEG channel can be formed, so that the depletion-type HEMT is conducted. When Vgs>0, a relatively large gate current can be generated. When Vgs<0, the channel becomes narrow and the gate current decreases. When Vgs further decreases to a specific threshold voltage Vp (also referred to as a pinch-off voltage), the channel disappears, so that the depletion-type HEMT is disconnected.

In this embodiment of this application, a low-voltage depletion-type HEMT whose threshold voltage Vp has a relatively small absolute value is preferably used, for example, Vp=−2 V, to reduce difficulty of driving the gallium nitride component. Driving logic of the gallium nitride component shown in FIG. 11 is specifically described below.

Figure 12:
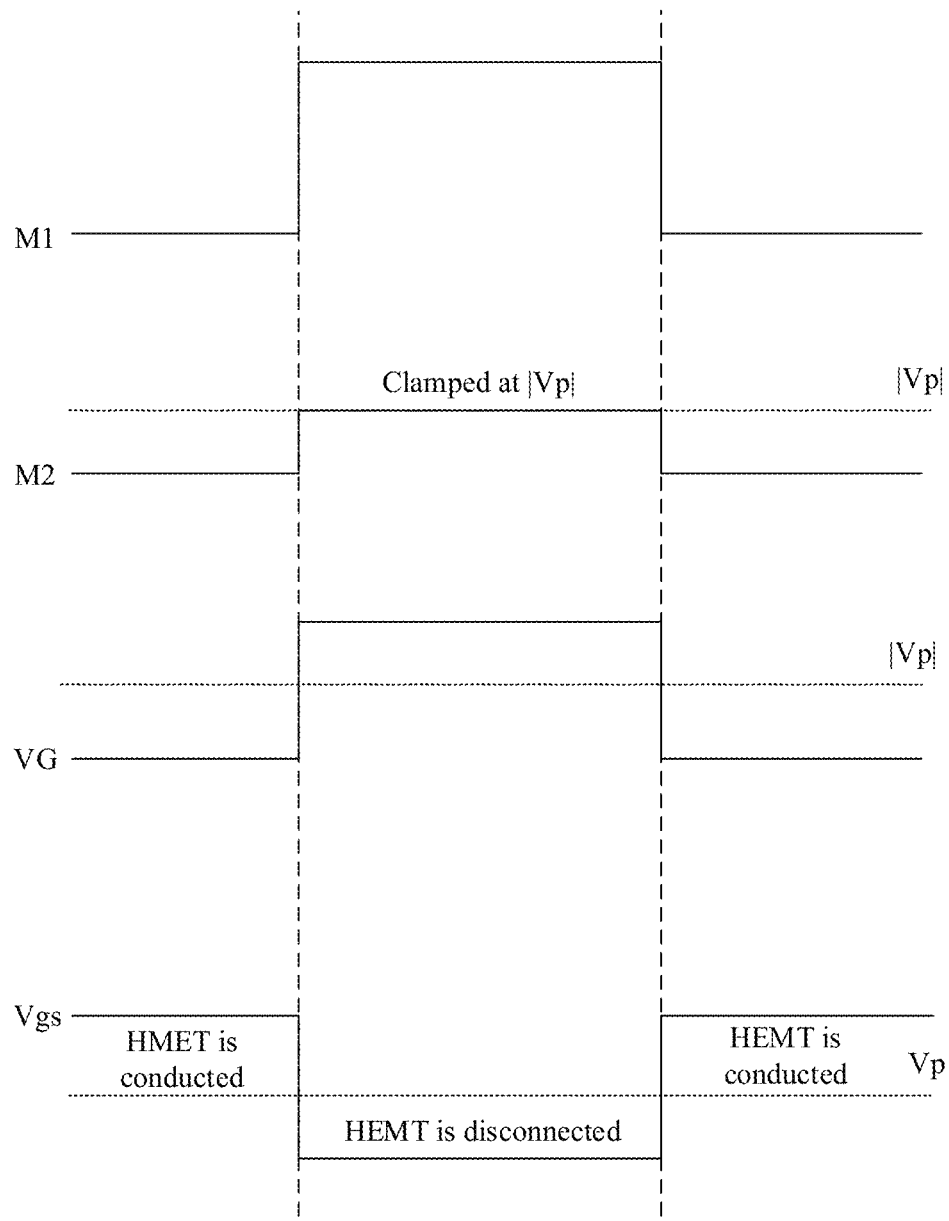
FIG. 12 is a schematic diagram of driving logic of a gallium nitride component according to an embodiment of this application.

As shown in FIG. 12, in a process of enabling the gallium nitride component, when a driving signal VG<|Vp| (an absolute value of Vp), Vgs>Vp, the depletion-type HEMT is in a conducted state, and a potential of the ohmic gate M2 is the same as a potential of the driving signal VG. When the driving signal VG≥|Vp| (when VG=6 V), Vgs≤Vp, and the depletion-type HEMT is in a disconnected state. In this case, the potential of the ohmic gate M2 is clamped at IVO by the depletion-type HEMT, and the Schottky gate M1 is also maintained at a high potential by the driving signal VG, so that establishment of the 2DEG of the gallium nitride component is maintained, thereby maintaining a conducted state of the gallium nitride component. In a state in which the gallium nitride component is disabled, for example, when the driving signal VG=0 V, the potential of the ohmic gate M2 is pulled down to a zero potential.

It should be additionally noted that in this embodiment of this application, a leakage current feature of the gate g of the depletion-type HEMT and the threshold voltage Vp can be changed by changing a size of the depletion-type HEMT, to change a clamped potential |Vp| of the ohmic gate M2. Different |Vp| may enable the gallium nitride component to have different leakage current levels and different electron hole injection capabilities. A person skilled in the art may probably select a size of the depletion-type HEMT based on an actual requirement of circuit design. This is not specifically limited in this embodiment of this application.

The objectives, technical solutions, and benefits of the present invention are further described in detail in the foregoing specific embodiments. It should be understood that the foregoing descriptions are merely specific embodiments of the present invention, but are not intended to limit the protection scope of the present invention. Any modification, equivalent replacement, or improvement made within the spirit and principle of the present invention shall fall within the protection scope of the present invention.

What is claimed is:

1. A gallium nitride component, comprising:
a substrate;
a gallium nitride (GaN) buffer layer formed on the substrate;
an aluminum gallium nitride (AlGaN) barrier layer formed on the GaN buffer layer; and
a source, a drain, and a gate formed on the AlGaN barrier layer; wherein
the gate comprises a P-doped gallium nitride (P—GaN) cap layer formed on the AlGaN barrier layer, and a first gate metal and a second gate metal formed on the P—GaN cap layer, wherein a Schottky contact is formed between the first gate metal and the P—GaN cap layer, and an ohmic contact is formed between the second gate metal and the P—GaN cap layer, wherein the first gate metal is not in contact with the second gate metal.

2. The gallium nitride component according to claim 1, wherein the first gate metal and the second gate metal are disposed in parallel at intervals along a direction perpendicular to a gate width direction of the gate.

3. The gallium nitride component according to claim 1, wherein the gate comprises a plurality of first gate metals and a plurality of second gate metals.

4. The gallium nitride component according to claim 3, wherein the plurality of first gate metals and the plurality of second gate metals are alternately distributed at intervals along a gate width direction of the gate.

5. The gallium nitride component according to claim 3, wherein the plurality of second gate metals comprise one longitudinal gate metal that is close to an edge of the P—GaN cap layer and parallel to a gate width direction of the gate, and that extends along the gate width direction, and a plurality of lateral gate metals distributed and disposed along the gate width direction, and one end of each lateral gate metal of the plurality of lateral gate metals is connected to the longitudinal gate metal.

6. The gallium nitride component according to claim 5, wherein the plurality of first gate metals and the plurality of lateral gate metals are alternately distributed along the gate width direction.

7. A gallium nitride component, comprising:
a substrate;
a gallium nitride (GaN) buffer layer formed on the substrate;
an aluminum gallium nitride (AlGaN) barrier layer formed on the GaN buffer layer; and
a source, a drain, and a gate formed on the AlGaN barrier layer;
wherein:
the gate comprises a P-doped gallium nitride (P—GaN) cap layer formed on the AlGaN barrier layer, and a first gate metal and a second gate metal formed on the P—GaN cap layer, wherein a Schottky contact is formed between the first gate metal and the P—GaN cap layer, and an ohmic contact is formed between the second gate metal and the P—GaN cap layer, the gallium nitride component further comprising a depletion-type high electron mobility transistor (HEMT);
a source of the depletion-type HEMT is coupled to the first gate metal;
a gate of the depletion-type HEMT is coupled to the source of the gallium nitride component; and
a drain of the depletion-type HEMT is coupled to the second gate metal.

8. A drive circuit, comprising:
a gate driver; and
a gallium nitride component, the gallium nitride component comprising:
   a substrate;
   a gallium nitride (GaN) buffer layer formed on the substrate;
   an aluminum gallium nitride (AlGaN) barrier layer formed on the GaN buffer layer; and
   a source, a drain, and a gate formed on the AlGaN barrier layer; wherein
   the gate comprises a P-doped gallium nitride (P—GaN) cap layer formed on the AlGaN barrier layer, and a first gate metal and a second gate metal formed on the P—GaN cap layer;
   a Schottky contact is formed between the first gate metal and the P—GaN cap layer, and an ohmic contact is formed between the second gate metal and the P—GaN cap layer; and
   the first gate metal and the second gate metal of the gallium nitride component are coupled to a signal output end of the gate driver, and a gate driving resistor and a switch are connected in series between the second gate metal and the signal output end of the gate driver.

9. The drive circuit according to claim 8, wherein the first gate metal and the second gate metal are disposed in parallel at intervals along a direction perpendicular to a gate width direction of the gate.

10. The drive circuit according to claim 8, wherein the gate comprises a plurality of first gate metals and a plurality of second gate metals.

11. The drive circuit according to claim 10, wherein the plurality of first gate metals and the plurality of second gate metals are alternately distributed at intervals along a gate width direction of the gate.

12. The drive circuit according to claim 10, wherein the plurality of second gate metals comprise one longitudinal gate metal that is close to an edge of the P—GaN cap layer and parallel to a gate width direction of the gate, and that extends along the gate width direction, and a plurality of lateral gate metals distributed and disposed along the gate width direction, and one end of each lateral gate metal of the plurality of lateral gate metals is connected to the longitudinal gate metal.

13. The drive circuit according to claim 12, wherein the plurality of first gate metals and the plurality of lateral gate metals are alternately distributed along the gate width direction.

14. The drive circuit according to claim 8, wherein
the switch is configured to open after a delay of preset duration when a rising edge of a driving signal of the gate driver arrives.

15. The drive circuit according to claim 8, wherein
the switch is configured to close when a falling edge of a driving signal of the gate driver arrives.

* * * * *